(12) United States Patent
Gosavi et al.

(10) Patent No.: US 11,417,830 B2
(45) Date of Patent: Aug. 16, 2022

(54) MAGNETICALLY DOPED SPIN ORBIT TORQUE ELECTRODE FOR PERPENDICULAR MAGNETIC RANDOM ACCESS MEMORY

(71) Applicant: Intel Corporation, Santa Clara, CA (US)

(72) Inventors: Tanay Gosavi, Hillsboro, OR (US); Sasikanth Manipatruni, Portland, OR (US); Chia-Ching Lin, Portland, OR (US); Gary Allen, Portland, OR (US); Kaan Oguz, Beaverton, OR (US); Kevin O'Brien, Portland, OR (US); Noriyuki Sato, Hillsboro, OR (US); Ian Young, Portland, OR (US); Dmitri Nikonov, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 780 days.

(21) Appl. No.: 16/024,709

(22) Filed: Jun. 29, 2018

(65) Prior Publication Data
US 2020/0006636 A1 Jan. 2, 2020

(51) Int. Cl.
| | | |
|---|---|---|
| *H01L 43/02* | (2006.01) | |
| *H01L 27/22* | (2006.01) | |
| *G11C 11/16* | (2006.01) | |
| *H01L 43/12* | (2006.01) | |
| *H01L 43/10* | (2006.01) | |

(52) U.S. Cl.
CPC ............ *H01L 43/02* (2013.01); *G11C 11/161* (2013.01); *G11C 11/1675* (2013.01); *H01L 27/222* (2013.01); *H01L 43/12* (2013.01); *H01L 43/10* (2013.01)

(58) Field of Classification Search
CPC ... G11C 11/00; G11C 11/161; G11C 11/1675; H01L 43/02; H01L 27/222; H01L 43/12; H01L 43/10
USPC ..................................................... 365/158
See application file for complete search history.

(56) References Cited

U.S. PATENT DOCUMENTS

| | | | | |
|---|---|---|---|---|
| 2019/0304525 A1* | 10/2019 | Manipatruni | ......... | H01L 27/222 |
| 2019/0305212 A1* | 10/2019 | Gosavi | .................... | H01L 43/04 |
| 2019/0305216 A1* | 10/2019 | Gosavi | .................... | H01L 43/08 |
| 2020/0006637 A1* | 1/2020 | Gosavi | ................... | H01L 27/228 |
| 2020/0006643 A1* | 1/2020 | Gosavi | ................... | H01L 27/228 |

\* cited by examiner

*Primary Examiner* — Harry W Byrne
(74) *Attorney, Agent, or Firm* — Schwabe, Williamson & Wyatt, P.C.

(57) ABSTRACT

Embodiments herein relate to magnetically doping a spin orbit torque electrode (SOT) in a magnetic random access memory apparatus. In particular, the apparatus may include a free layer of a magnetic tunnel junction (MTJ) coupled to a SOT electrode that is magnetically doped to apply an effective magnetic field on the free layer, where the free layer has a magnetic polarization in a first direction and where current flowing through the magnetically doped SOT electrode is to cause the magnetic polarization of the free layer to change to a second direction that is substantially opposite to the first direction.

12 Claims, 6 Drawing Sheets

MAGNETICALLY DOPED SPIN ORBIT TORQUE ELECTRODE FOR PERPENDICULAR MAGNETIC RANDOM ACCESS MEMORY

FIELD

Embodiments of the present disclosure generally relate to the field of magnetic random access memory (MRAM), and in particular to a spin orbit torque (SOT) electrode used in MRAM.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

For in-plane polarized magnetic films, electron spin currents arising from the spin-Hall effect (SHE) within heavy metals has been shown to apply spin-transfer torques to a magnet. The SHE may be used to change a magnetic polarity of a free layer of a magnetic tunnel junction (MTJ) used to implement MRAM.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
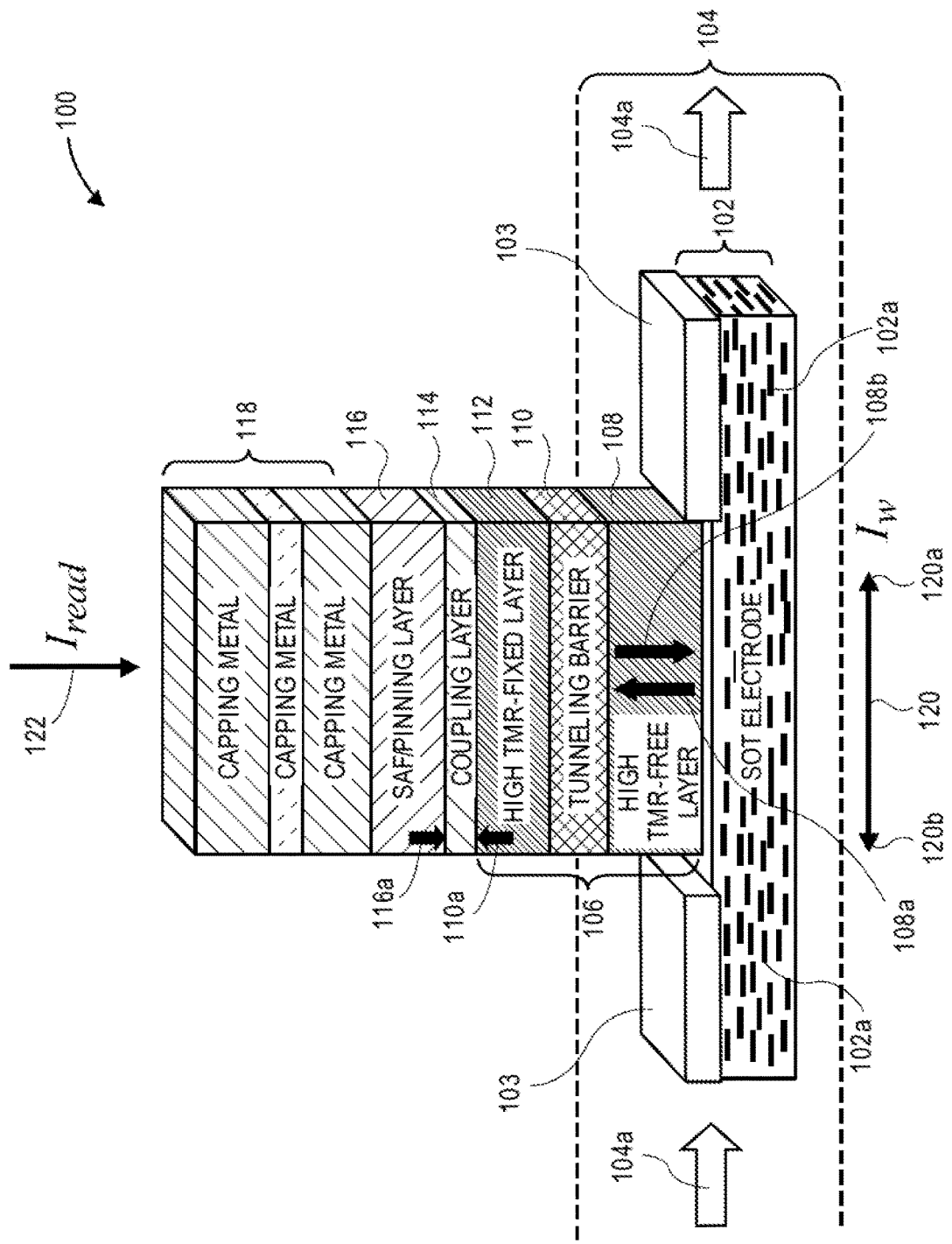
FIG. 1 illustrates an example of an MTJ on a SOT electrode doped with magnetic material, in accordance with various embodiments.

Embodiments of the present disclosure generally relate to apparatuses, processes, or systems for the manufacture or use of MRAM, and in particular perpendicular spin orbit torque (PSOT) MRAM. In legacy implementations, the MRAM may include a SOT electrode that may facilitate switching the magnetic field within a free layer of a MTJ magnetically coupled to the SOT electrode.

In legacy implementations, PSOT switching of an MTJ free layer may be performed by using inplane magnetic inserts in the magnetic stack or by using the magnetic via layer, or by using antiferromagnetic materials for inplane exchange bias. These legacy implementations may involve complex circuits to implement two-pulse switching. They may increase the complexity of the MRAM stack and its fabrications steps. These legacy approaches may in turn affect the tunnel magnetoresistance (TMR) yield or reliability of the memory. Legacy implementations may also constrain the SOT electrode to a antiferromagnetic material, which during operation may result in a low Neel temperature and low spin orbit coupling.

Embodiments described herein may facilitate the use of materials with high spin orbit coupling directly in the MTJ device without the need for additional inserts or magnetic vias. As a result, this may also simplify the fabrication and/or integration process of manufacturing MRAM. In addition, embodiments described herein may be used in combination with legacy implementations that may use a magnetic via or magnetic inserts, to increase the effective magnetic field on one or more MTJ magnetic free layer.

In embodiments, the SOT electrode may include magnetic material, which may result in the SOT electrode referred to as "doped" with magnetic material. The doping may be accomplished by co-sputtering or by using alloy targets, for example magnetic materials and SOT materials mixed as alloys directly in sputtering target, that result in the doped SOT electrode having an inplane magnetic anisotropy.

As a result, the SOT electrode may have a net magnetic moment. This moment may interact with the adjacent MTJ free layer due to a dipole interaction, and may apply an effective field on the free layer magnet in a direction opposite to the internal magnetic moment. This effective field may then break the symmetry of the spin orbit switching of the free layer, thereby enabling repeatable bidirectional current switching. The doped SOT layer may create an inplane exchange bias or a dipole field. The resulting effective field may generate an inplane magnetic field on the perpendicular magnetic free layer of the MTJ. As a result, deterministic bidirectional switching of the PSOT MRAM may be facilitated by flipping the polarity of the magnetic free layer depending on the direction of current flow through the doped SOT. This may enable repeatable bidirectional switching of a perpendicular magnetic polarity within one or more free layers of the MTJ coupled with the doped SOT.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

FIG. 1 illustrates an example of an MTJ on a SOT electrode doped with magnetic material, in accordance with various embodiments. Diagram 100 is an embodiment of a MRAM stack that may include a SOT electrode 102. In embodiments, the SOT electrode 102 may include magnetic material 102a. The SOT electrode 102 may be coupled with an MTJ 106 that may include a magnetic free layer 108, a tunneling barrier 110, and a magnetic fixed layer 112. In embodiments, the magnetic fixed layer 112 may be a fixed magnet with a fixed polarity which may be perpendicular to the SOT electrode 102. The tunneling barrier 110 may be a MgO tunneling oxide. The tunneling barrier 110 may also include, but is not limited to, $Al_2O_3$, MgO, AlN, MgFeO, or include, but is not limited to, a doping of MgO and $Al_2O_3$. In embodiments, the magnetic free layer 108 may be coupled with and/or in close proximity to the SOT electrode 102. In embodiments, inplane spin currents on the SOT electrode 102 resulting from current flow 120 through the SOT electrode 102 may cause the magnetic free layer 108 to flip its polarity of polarization 108a, 108b.

In embodiments, the magnetic material 102a within the SOT electrode 102 may cause an effective field 104, which may be also referred to as a magnetic field, to permanently surround the SOT electrode 102. As a result, the effective field 104 may have an effective field direction 104a. The effective field 104 may also partially or completely surround the magnetic free layer 108. As a result, the effective field 104, the polarization 108a, 108b of the magnetic free layer 108 may perpendicular or substantially perpendicular to a plane of the SOT electrode 102 or of the magnetic free layer 108. In embodiments, the magnetic free layer 108 and/or the magnetic fixed layer 112 may be a high TMR layer that may be enabled by one or more Ferromagnetic layer.

The magnetic free layer 108 may have a first magnetic polarization of 108a and a second magnetic polarization of 108b, each in a substantially opposite direction, and each may be substantially perpendicular to a plane of the SOT electrode 102. As a result, repeatable bidirectional switching of the magnetic polarity of the magnetic free layer 108 may be achieved by applying a current to the SOT electrode 102 while keeping each magnetic free layer 108, polarization 108a, 108b, substantially perpendicular to a plane of the SOT electrode 102.

In embodiments, the composition of the SOT electrode 102 may include one or more heavy metals, AFM, or topological insulator (TI). In embodiments, SOT electrode 102 may include spin orbit TI, 2D or 3D materials which may include, but are not limited to, one or more of: graphene, $TiSe_2$, $WSe_2$, $MoS_2$, $WSe_2$, $MoSe_2$, $B_{253}$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In embodiments, SOT electrode 102 may include spin orbit material that may exhibit a Rashba-Bychkov effect in the form $ROCh_2$, where 'It' includes, but is not limited to, one or more of: La, Ce, Pr, Nd, Sr, Sc, Ga, Al, or In, and where "Ch" may be a chalcogenide which may include, but is not limited to, one or more of: S, Se, or Te.

An AFM may include, but is not limited to, Co/Antiferro-magnet, Fe/Antiferro-magnet, Ni/Antiferro-magnet, MnGa/Antiferro-magnet, MnGeGa/Antiferro-magnet, or Bct-Ru/Antiferro-magnet. A TI may also include, but is not limited to, $Bi_2Se_3$, $Bi_xTeySe_{1-x-y}$, $Bi_xSb_{1-x}$, $WSe_2$, $WTe_2$, $PtSe_2$, $PtTe_2$, $MoSe_2$, $MoS_2$, or $MoTe_2$, $TiS_2$, $WS_2$, $TiSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

The magnetic material 102a used to dope the SOT electrode 102 may include, but is not limited to, ferromagnets such as cobalt (Co), iron (Fe), nickel (Ni), MnGa, MnGeGa, Bct-Ru, Gd, or Tb. Magnetic material 102a may include a material with perpendicular magnetic anisotropy (PMA) with an anisotropy axis perpendicular to the plane of the SOT electrode 102. More doping materials may include, but are not limited to, Heusler $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In embodiments, the SOT electrode 102 may be magnetically doped using the magnetic material 102a by using co-sputtering techniques or by using alloy targets.

In embodiments, the magnetic fixed layer 112 of the MTJ 106 may be coupled with a coupler layer 114 that may be coupled to a synthetic anti-Ferro-magnet (SAF) layer 116. The SAF layer 116 may have a polarity direction 116a that may be perpendicular to a plane of the SOT electrode 102. The SAF layer 116 may facilitate maintaining a polarity direction 110a of the magnetic fixed layer 110. In embodiments, one or more capping metals 118 may be applied.

In embodiments, during operation a current 120 may be applied along the SOT electrode 102, which may be electrically coupled with copper pads 103 to an energy source (not shown). Current flowing in a first direction 120a may cause the magnetic polarity within the magnetic free layer 108 to be in a first direction of polarization 108a, and current flowing in a second direction 120b may cause the magnetic polarity within the magnetic free layer 108 to be in a second direction of polarization 108b. In embodiments, whether the magnetic polarity within the magnetic free layer 108 is in the first direction of polarization 108a or the second direction of polarization 108b may determine whether the MRAM is set to "1" or "0." To read the memory, a current 122 may be applied to the capping metal 118. A level of resistance encountered to the current 122 may determine whether the MRAM is set to "1" or to "0."

Figure 2:
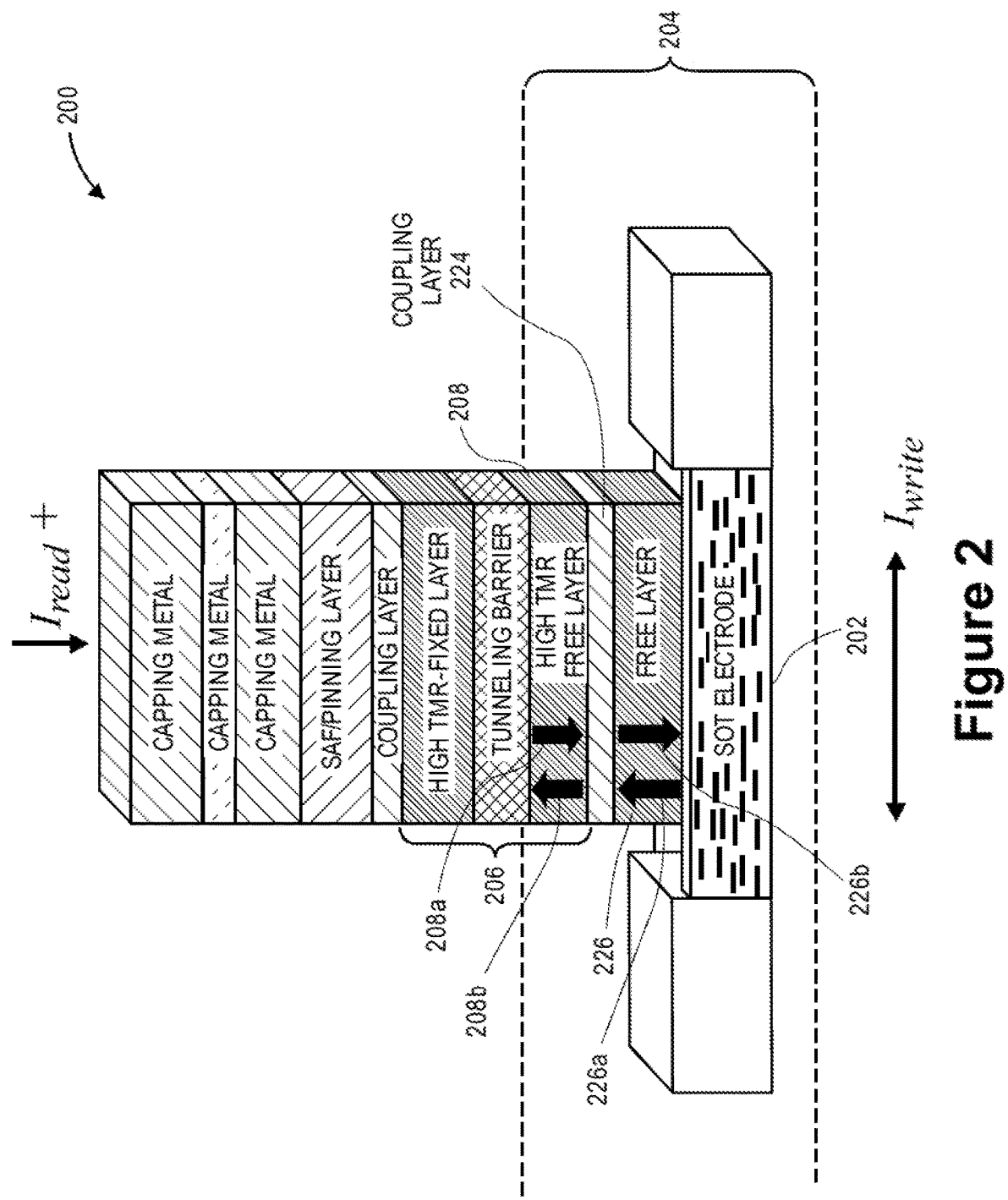
FIG. 2 illustrates an example of an MTJ with an additional magnetic free layer on a SOT electrode that has been doped with magnetic material, in accordance with various embodiments.

FIG. 2 illustrates an example of an MTJ with an additional magnetic free layer on a SOT electrode that has been doped with magnetic material, in accordance with various embodiments. Diagram 200 shows an embodiment of an MRAM stack that may include an additional magnetic free layer 226 and an additional coupling layer 224 between the SOT electrode 202, which may be similar to SOT electrode 102 of FIG. 1, and the MTJ 206, which may be similar to MTJ 106 of FIG. 1. In this embodiment, the effective field 204, which may be similar to effective field 104 of FIG. 1, may interact with all or part of the magnetic free layer 208 and/or additional magnetic free layer 226. This interaction may cause a first magnetic polarization 208a and a second magnetic polarization 208b, which may be similar to first magnetic polarization 108a and second magnetic polarization 108b of FIG. 1, in the magnetic free layer 208 and a corresponding first magnetic polarization 226a and a second magnetic polarization 226b in the additional magnetic free layer 226 that may be perpendicular to a plane of the SOT electrode 202. In embodiments, the magnetic free layer 208 may be a high TMR magnetic free layer.

Figure 3:
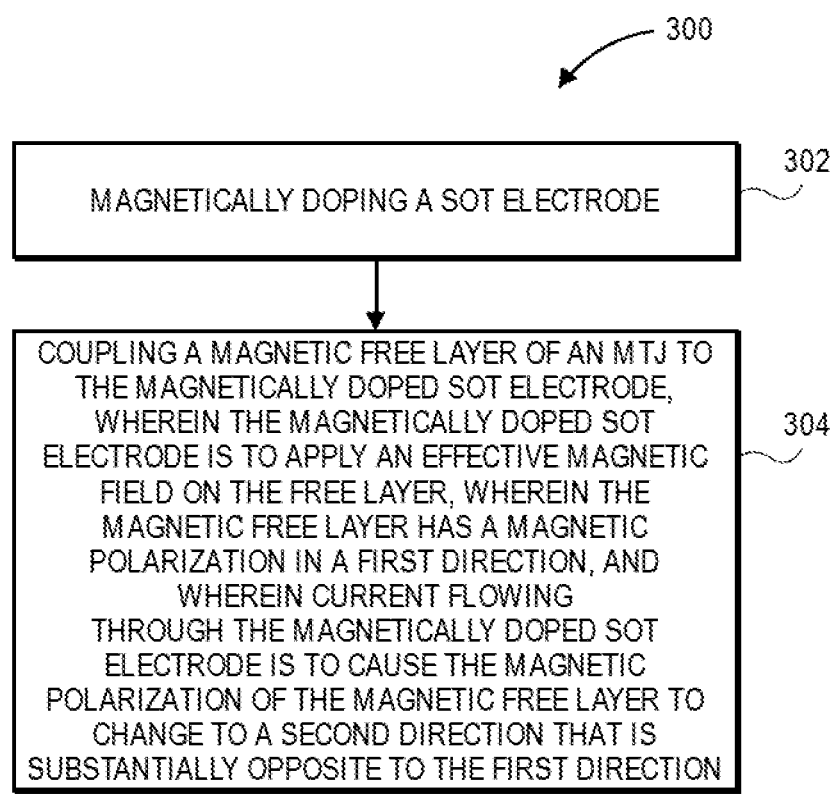
FIG. 3 illustrates an example process for applying a magnetically doped SOT electrode to an MTJ, in accordance with various embodiments.

FIG. 3 illustrates an example process for applying a magnetically doped SOT electrode to an MTJ, in accordance with various embodiments. The example process may result in the MRAM stack of diagram 100 or the MRAM stack of diagram 200, or part thereof.

At block 302, the process include magnetically doping a SOT electrode. In embodiments, and magnetic material such as magnetic material 102a of FIG. 1, may be incorporated within the SOT electrode, such as SOT electrode 102 of FIG. 1. This incorporation may also be referred to as magnetic doping. In embodiments, the incorporation may be done using a co-sputtering process, using alloy targets, or by some other suitable process. In addition, materials may be deposited by atomic layer deposition, ebeam evaporation, thermal evaporation, pulsed laser deposition, ion beam deposition, and the like. As a result of the incorporation, the SOT electrode 102a may acquire an inplane magnetic anisotropy.

At block 304, the process include coupling a free layer of an MTJ to the magnetically doped SOT electrode, wherein the magnetically doped SOT electrode is to apply an effective magnetic field on the free layer, wherein the free layer has a magnetic polarization in a first direction, and wherein current flowing through the magnetically doped SOT electrode is to cause the magnetic polarization of the magnetic free layer to change to a second direction that is substantially opposite to the first direction. In embodiments, the doped SOT electrode 102 may be coupled to the magnetic free layer 108 of FIG. 1, or coupled to the additional magnetic free layer 226 of FIG. 2. In embodiments, the coupling may be due to a dipole field between adjacent magnets. In embodiments, there may also be ferromagnetic or antiferromagnetic coupling due to two magnets, e.g. one in the SOT electrode 102 layer and one in the magnetic free layer 108, being next to or touching each other. In embodiments, when a current, such as current 120a or 120b of FIG. 1, may be applied to the SOT electrode 102, the resulting inplane spin currents in the SOT electrode 102 may cause the magnetic polarization in a first direction 108a of the magnetic free layer 108 to change to a magnetic polarization in a second direction 108b.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that may include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
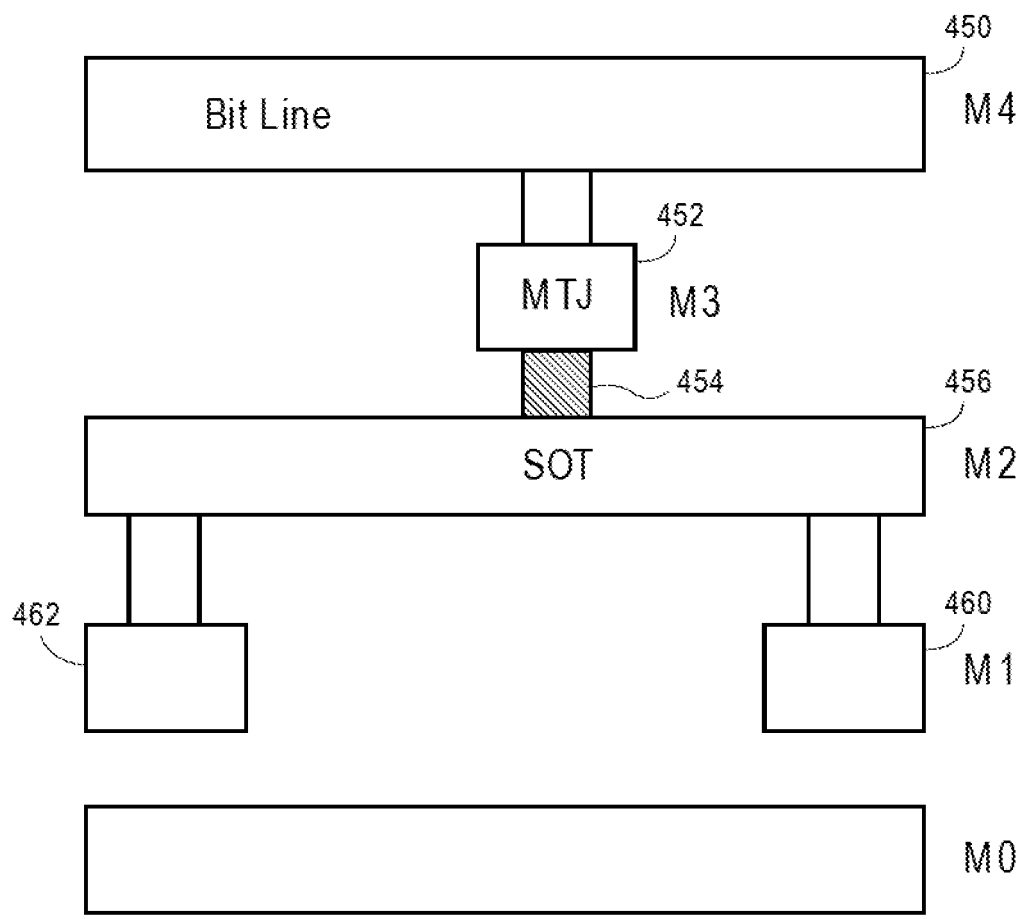
FIG. 4 shows a complimentary metal-oxide-semiconductor (CMOS) stack that integrates an MRAM, in accordance with various embodiments.

FIG. 4 shows a CMOS stack that integrates an MRAM, in accordance with various embodiments. The MTJ 452, which may be in metal layer 3, may be similar to MTJ 106 of FIG. 1, and may be coupled to the SOT 456, which may be in metal layer 2, and may be similar to SOT 102 of FIG. 1 or SOT 202 of FIG. 2. Sources for current flow through the SOT 456 may be through metal layer 1 via 462 and/or through metal layer 1 via 460. Bit line 450, which may be in metal layer 4, may provide current to the MTJ 452, similar to current 122 of FIG. 1, that may be used to read a bit of the MRAM.

Figure 5:
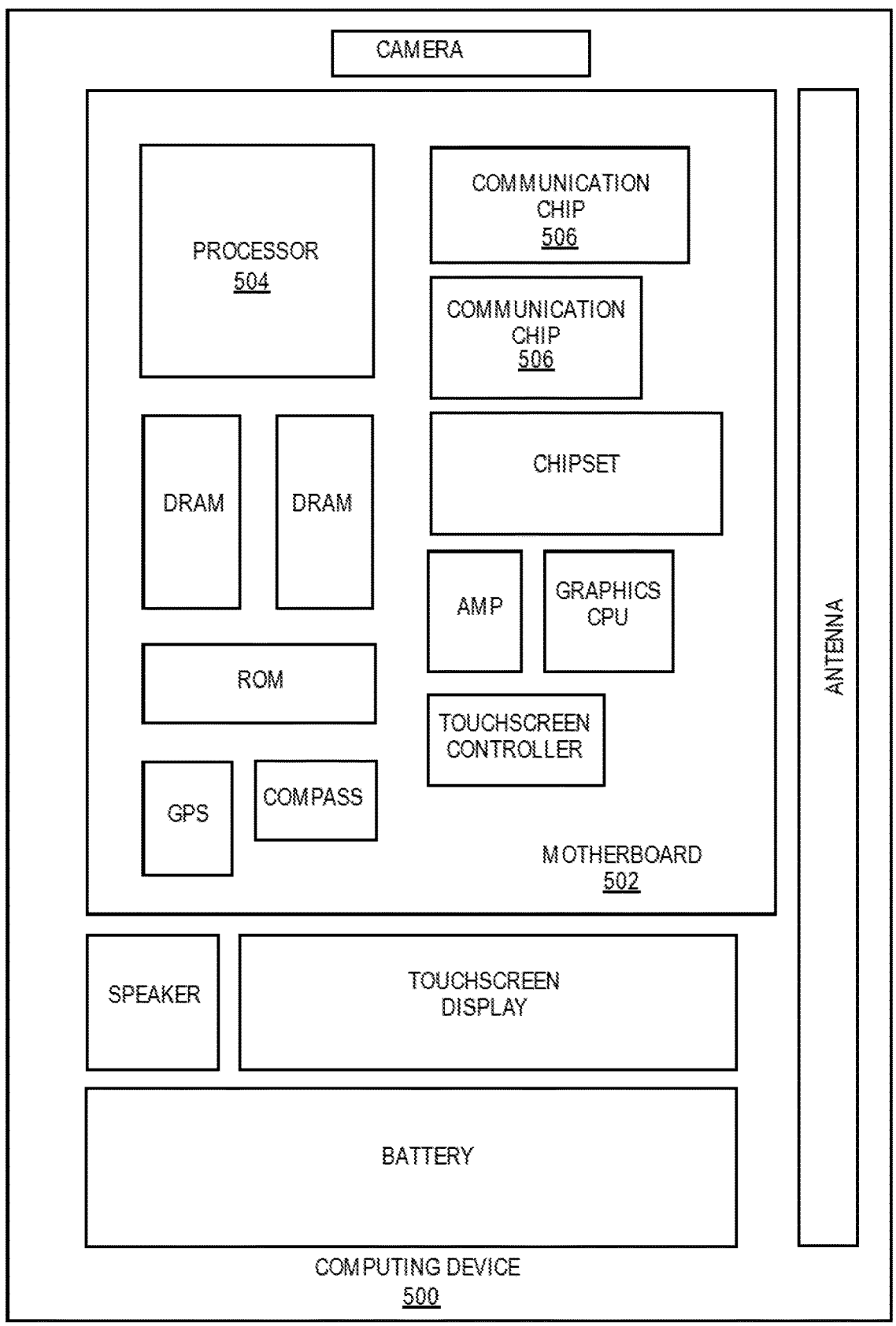
FIG. 5 illustrates a computing device 500 in accordance with various embodiments.

FIG. 5 illustrates a computing device 500 in accordance with various embodiments. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 406. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
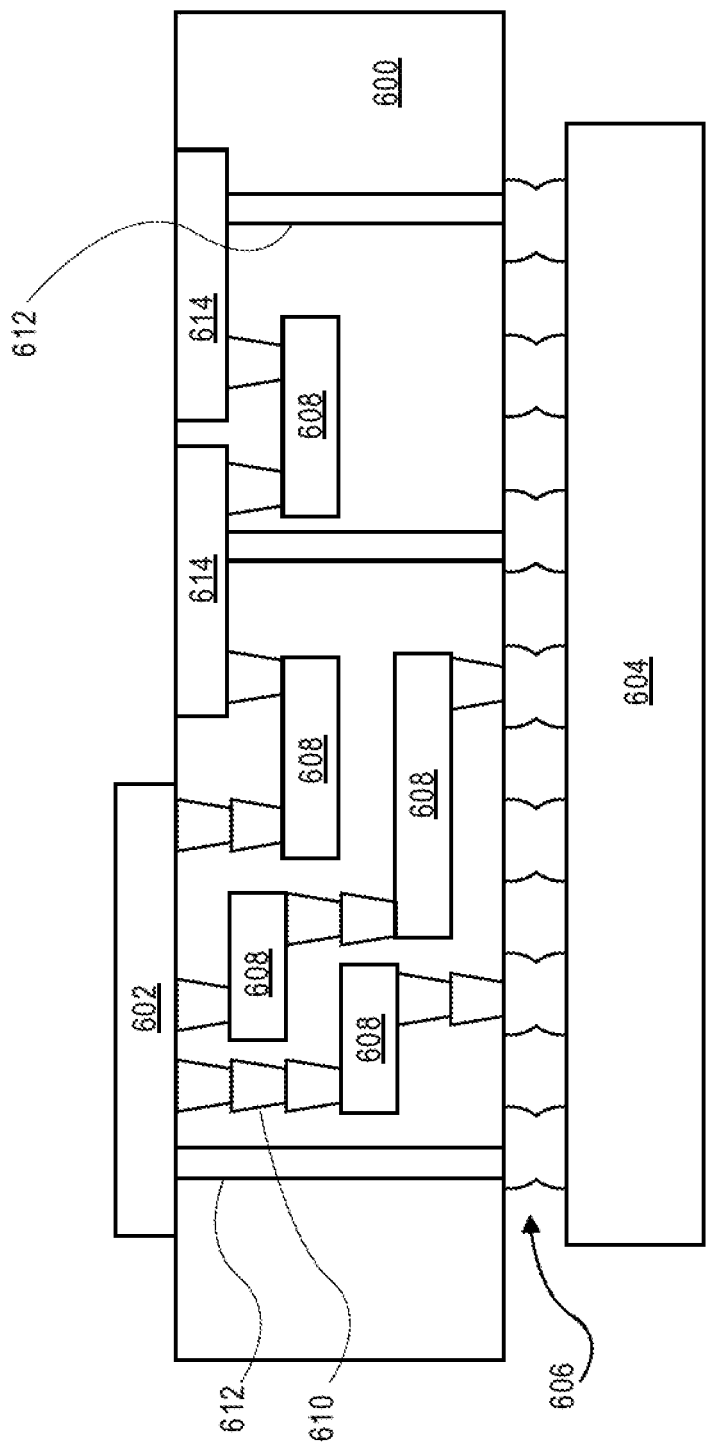
FIG. 6 illustrates an interposer 600 that includes one or more embodiments.

FIG. 6 illustrates an interposer 600 that includes one or more embodiments. The interposer 500 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

EXAMPLES

Example 1 may be an apparatus comprising: a SOT electrode that is magnetically doped; a free layer of a MTJ coupled to the SOT electrode; wherein the magnetically doped SOT electrode is to apply an effective magnetic field on the free layer; wherein the free layer has a magnetic polarization in a first direction; and wherein current flowing through the magnetically doped SOT electrode is to cause the magnetic polarization of the free layer to change to a second direction that is substantially opposite to the first direction.

Example 2 may include the apparatus of example 1, wherein the magnetically doped SOT electrode has an in-plane magnetic anisotropy.

Example 3 may include the apparatus of example 1, wherein the magnetic polarization of the free layer is substantially perpendicular to a plane of the SOT electrode.

Example 4 may include the apparatus of example 1, wherein the magnetically doped SOT electrode further comprises magnetic material included within the SOT electrode.

Example 5 may include the apparatus of example 4, wherein the magnetic material includes Cobalt, Iron, Nickel, or other ferromagnetic material.

Example 6 may include the apparatus of example 4, wherein the magnetic material ranges from 30% to 1% of a composition of the SOT electrode.

Example 7 may include the apparatus of example 1, wherein the free layer is a TMR-free layer.

Example 8 may include the apparatus of example 1, wherein the free layer is a first free layer; and further comprising: a second free layer positioned between the first free layer and the magnetically doped SOT electrode; a coupling layer positioned between the first free layer and the second free layer; and wherein the magnetically doped SOT electrode is to apply an effective field on the first free layer and the second free layer.

Example 9 may include the apparatus of example 8, wherein the first free layer is a TMR-free layer.

Example 10 may include the apparatus of example 8, wherein the first free layer and the second free layer have a common magnetic polarization in a first direction.

Example 11 may include the apparatus of example 10, wherein current flowing through the magnetically doped SOT electrode is to cause the magnetic polarization of the first free layer and the second free layer to change to a second direction that is substantially opposite to the first direction.

Example 12 may include the apparatus of example 11, wherein the magnetic polarization of the first free layer and the second free layer are substantially perpendicular to a plane of the magnetically doped SOT electrode.

Example 13 may be a method comprising: magnetically doping a spin orbit torque (SOT) electrode; coupling a free layer of an MTJ to the magnetically doped SOT electrode, wherein the magnetically doped SOT electrode is to apply an effective magnetic field on the free layer, wherein the free layer has a magnetic polarization in a first direction, and wherein current flowing through the magnetically doped SOT electrode is to cause the magnetic polarization of the free layer to change to a second direction that is substantially opposite to the first direction.

Example 14 may include the method of example 13, wherein the magnetically doped SOT electrode has an in-plane magnetic anisotropy.

Example 15 may include the method of example 13, wherein the magnetic polarization of the free layer is substantially perpendicular to a plane of the SOT electrode.

Example 16 may include the method of example 13, wherein magnetically doping the SOT electrode further comprises inserting magnetic material within the SOT electrode.

Example 17 may include the method of example 16, wherein the magnetic material includes Cobalt, Iron, Nickel, or other ferromagnetic material.

Example 18 may include the method of example 16, wherein the magnetic material ranges from 30% to 1% of a composition of the SOT electrode.

Example 19 may include the method of example 13, wherein the free layer is a tunnel magnetoresistive (TMR)-free layer.

Example 20 may include the method of example 13, wherein the free layer is a first free layer; and further comprising: positioning a second free layer between the first free layer and the magnetically doped SOT electrode; and positioning a coupling layer between the first free layer and the second free layer, wherein the magnetically doped SOT electrode is to apply an effective field on the first free layer and the second free layer.

Example 21 may include the method of example 20, wherein the first free layer and the second free layer have a common magnetic polarization in a first direction.

Example 22 may include the method of example 21, further comprising applying current through the magnetically doped SOT electrode is to cause the magnetic polarization of the first free layer and the second free layer to change to a second direction that is substantially opposite to the first direction.

Example 23 may include the method of example 22, wherein the magnetic polarization of the first free layer and the second free layer are substantially perpendicular to a plane of the magnetically doped SOT electrode.

Example 24 may be a method to write to a MTJ, the method comprising: applying a current to a SOT electrode that includes a magnetic material; wherein the SOT electrode is coupled with a MTJ having a free layer with a magnetic polarization in a first direction substantially perpendicular to a plane of the SOT electrode; wherein the magnetic material in the SOT electrode is to apply an effective field on the free layer; and wherein the current on the SOT electrode is to cause the magnetic polarization of the free layer to change to a second direction that is substantially opposite to the first direction.

Example 25 may include the method of example 24, wherein the magnetic polarization of the first free layer and the second free layer are substantially perpendicular to a plane of the SOT electrode that includes the magnetic material.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a spin orbit torque (SOT) electrode that is magnetically doped;
   a free layer of a magnetic tunnel junction (MTJ) coupled to the SOT electrode;
   wherein the magnetically doped SOT electrode is to apply an effective magnetic field on the free layer;
   wherein the free layer has a magnetic polarization in a first direction; and
   wherein current flowing through the magnetically doped SOT electrode is to cause the magnetic polarization of the free layer to change to a second direction that is substantially opposite to the first direction.

2. The apparatus of claim 1, wherein the magnetically doped SOT electrode has an in-plane magnetic anisotropy.

3. The apparatus of claim 1, wherein the magnetic polarization of the free layer is substantially perpendicular to a plane of the SOT electrode.

4. The apparatus of claim 1, wherein the magnetically doped SOT electrode further comprises magnetic material included within the SOT electrode.

5. The apparatus of claim 4, wherein the magnetic material includes Cobalt, Iron, Nickel, or other ferromagnetic material.

6. The apparatus of claim 4, wherein the magnetic material ranges from 30% to 1% of a composition of the SOT electrode.

7. The apparatus of claim 1, wherein the free layer is a tunnel magnetoresistive (TMR)-free layer.

8. The apparatus of claim 1, wherein the free layer is a first free layer; and further comprising:
   a second free layer positioned between the first free layer and the magnetically doped SOT electrode;
   a coupling layer positioned between the first free layer and the second free layer; and
   wherein the magnetically doped SOT electrode is to apply an effective field on the first free layer and the second free layer.

9. The apparatus of claim 8, wherein the first free layer is a TMR-free layer.

10. The apparatus of claim 8, wherein the first free layer and the second free layer have a common magnetic polarization in the first direction.

11. The apparatus of claim 10, wherein current flowing through the magnetically doped SOT electrode is to cause the magnetic polarization of the first free layer and the second free layer to change to the second direction that is substantially opposite to the first direction.

12. The apparatus of claim 11, wherein the magnetic polarization of the first free layer and the second free layer are substantially perpendicular to a plane of the magnetically doped SOT electrode.

* * * * *